(12) United States Patent
Hsu et al.

(10) Patent No.: US 7,223,647 B2
(45) Date of Patent: May 29, 2007

(54) METHOD FOR FORMING INTEGRATED ADVANCED SEMICONDUCTOR DEVICE USING SACRIFICIAL STRESS LAYER

(75) Inventors: Ju-Wang Hsu, Taipei (TW); Ming-Huan Tsai, Hsinchu (TW); Chien-Hao Chen, Ilan (TW); Yi-Chun Huang, Pingjhen (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 133 days.

(21) Appl. No.: 10/981,925

(22) Filed: Nov. 5, 2004

(65) Prior Publication Data

US 2006/0099745 A1 May 11, 2006

(51) Int. Cl.
*H01L 21/8238* (2006.01)
(52) U.S. Cl. ............ 438/199; 438/791; 438/938; 257/369; 257/288; 257/E21.64
(58) Field of Classification Search ............... 438/199, 438/791, 938; 257/369, 288, E21.64
See application file for complete search history.

(56) References Cited

U.S. PATENT DOCUMENTS

| 4,514,895 A | 5/1985 | Nishimura | |
| 6,563,152 B2 | 5/2003 | Roberds et al. | |
| 6,939,814 B2* | 9/2005 | Chan et al. | 438/778 |
| 7,022,561 B2* | 4/2006 | Huang et al. | 438/197 |
| 7,045,408 B2* | 5/2006 | Hoffmann et al. | 438/199 |
| 7,052,946 B2* | 5/2006 | Chen et al. | 438/199 |
| 2004/0104405 A1* | 6/2004 | Huang et al. | 257/199 |
| 2005/0145894 A1* | 7/2005 | Chau et al. | 257/288 |
| 2005/0186722 A1* | 8/2005 | Cheng et al. | 438/199 |
| 2005/0214998 A1* | 9/2005 | Chen et al. | 438/199 |

* cited by examiner

*Primary Examiner*—Chandra Chaudhari
*Assistant Examiner*—Steven J. Fulk
(74) *Attorney, Agent, or Firm*—Duane Morris LLP

(57) ABSTRACT

An integrated advanced method for forming a semiconductor device utilizes a sacrificial stress layer as part of a film stack that enables spatially selective silicide formation in the device. The low-resistance portion of the device to be silicided includes NMOS transistors and PMOS transistors. The stressed film may be a tensile or compressive nitride film. An annealing process is carried out prior to the silicide formation process. During the annealing process, the stressed nitride film preferentially remains over either the NMOS transistors or PMOS transistors, but not both, to optimize device performance. A tensile nitride film remains over the NMOS transistors but not the PMOS transistors while a compressive nitride film remains over the PMOS transistors but not the NMOS transistors, during anneal.

15 Claims, 10 Drawing Sheets

METHOD FOR FORMING INTEGRATED ADVANCED SEMICONDUCTOR DEVICE USING SACRIFICIAL STRESS LAYER

FIELD OF THE INVENTION

The present invention relates, most generally, to semiconductor devices and methods for forming the same. More particularly, the present invention relates to the use of a sacrificial stress layer in forming advanced semiconductor devices.

BACKGROUND

In today's rapidly advancing semiconductor manufacturing industry, reducing device feature sizes and increasing device speed is more and more emphasized. Versatile improvement approaches are applied to manufacturing processes to gain higher device performance. For example, a single semiconductor chip may be designed to include both low resistance areas and high resistance areas. With regard to the high resistance areas, an electrostatic discharge device (ESD) may advantageously be formed to prevent from external charging damage, for example. The ESD may be achieved through applying a sacrificial covering such as an oxide layer over portions of the device to serve as a mask and prevent silicide formation in these portions.

In the semiconductor manufacturing industry, it is known that the formation of stressed films over doped areas increases the speed of the associated semiconductor device by producing a mechanical stress in the underlying film or substrate that contains the dopant impurities. Such a stress increases the mobility of the dopant impurities. The dopant impurities or charge carriers with increased mobility enable faster operating speed for semiconductor devices such as transistors. It would therefore be desirable to utilize such stressed films in various appropriate applications.

With regard to the spatially selective silicidation process, one technique is to use an oxide film as the silicide prevention film in areas that are not to be silicided. The sacrificial oxide film is patterned and removed from the areas that are to be silicided. This typically involves multiple oxide etch or strip operations. After the silicide is formed in areas where the sacrificial oxide is not present, the sacrificial oxide film must be removed from the non-silicided areas. These oxide removal operations may create voids in oxide spacers formed alongside transistor gates formed beneath the sacrificial oxide film, and may also create other divots in the device, both of which degrade device performance. Another approach is to use a stressed nitride film as a suicide prevention layer. In order to utilize a tensile or compressive stressed silicon nitride film to increase carrier mobility and also act as a silicide prevention film, a stack of a stressed nitride film over an oxide film has been tried as a suicide resistant film stack.

A shortcoming associated with the use of the nitride film, however, is that, when a stressed nitride film remains over a transistor during anneal, device degradation may occur for either or both of the PMOS and NMOS transistors, depending on the type of silicon nitride film used. Conventional techniques employing a sacrificial nitride film as part of the silicide prevention films stack may therefore adversely affect device performance of either PMOS or NMOS transistors.

As such, it would be advantageous utilize a stressed silicon nitride film as a silicidation prevention film without degrading either NMOS or PMOS device performance.

SUMMARY OF THE INVENTION

To address these objects and in view of its purposes, the present invention provides a method for forming a semiconductor device. The method includes forming a plurality of transistors with un-annealed source/drain regions in the semiconductor device, the plurality of transistors including a PMOS transistor and an NMOS transistor, and disposing a stressed silicon nitride film over either the NMOS transistor or the PMOS transistor but not over the other of the NMOS transistor and the PMOS transistor. The method further includes annealing the source/drain regions with the stressed silicon nitride film in place over either the NMOS transistor or PMOS transistor, but not over the other one of the NMOS transistor and PMOS transistor.

In another embodiment, the present invention provides a method for forming a semiconductor device. The method includes forming a plurality of transistors including a PMOS transistor and an NMOS transistor, each having sidewall spacers. The method includes forming an oxide film on the plurality of transistors and patterning to reduce a thickness of the oxide film over a first one of the PMOS transistor and the NMOS transistor relative to a thickness of the oxide film over the other of the PMOS transistor and NMOS transistor. The oxide film is removed from at least portions of the semiconductor device, including from over the NMOS and PMOS transistors, such that a width of the sidewall spacers of the first one of the PMOS transistor and the NMOS transistor is less than the width of the sidewall spacers of the other of the PMOS and NMOS transistors.

In another embodiment, the present invention provides a method for forming a semiconductor device. The method includes forming a plurality of transistors including a PMOS transistor and an NMOS transistor, each having sidewall spacers, forming an oxide film on the plurality of transistors and, before the plurality of transistors has been annealed, forming a silicon nitride film over the oxide film and removing the silicon nitride film from over one of the PMOS transistor and the NMOS transistor then annealing. The silicon nitride film is stripped from over the other of the PMOS transistor and NMOS transistor to reduce the thickness of the oxide film over the one of the PMOS transistor and the NMOS transistor relative to a thickness of the same oxide film over the other of the PMOS transistor and the NMOS transistor; and the method further comprises removing the oxide film from at least portions of the semiconductor device, including from the NMOS transistor and the PMOS transistor, such that a width of the sidewall spacers of the one of the PMOS transistor and the NMOS transistor is less than a width of the sidewall spacers of the other of the PMOS transistor and the NMOS transistor.

Another aspect of the invention provides a semiconductor device comprising NMOS transistors and PMOS transistors and in which the NMOS transistors include NMOS sidewall spacers of a first width and the PMOS transistors include PMOS sidewall spacers of a second that is less or greater than the first width.

Another aspect of the invention provides a semiconductor device comprising an NMOS region and a PMOS region formed in a substrate wherein the NMOS region includes an NMOS shallow trench isolation (STI) structure therein and a divot of a first depth between the NMOS STI structure and the substrate. The PMOS region includes a PMOS STI structure therein and a divot of a second depth being less or greater than the first depth, between the PMOS STI structure and the substrate

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing. Included in the drawing are the following figures, each of which is a cross-sectional view.

DETAILED DESCRIPTION

Figure 1:
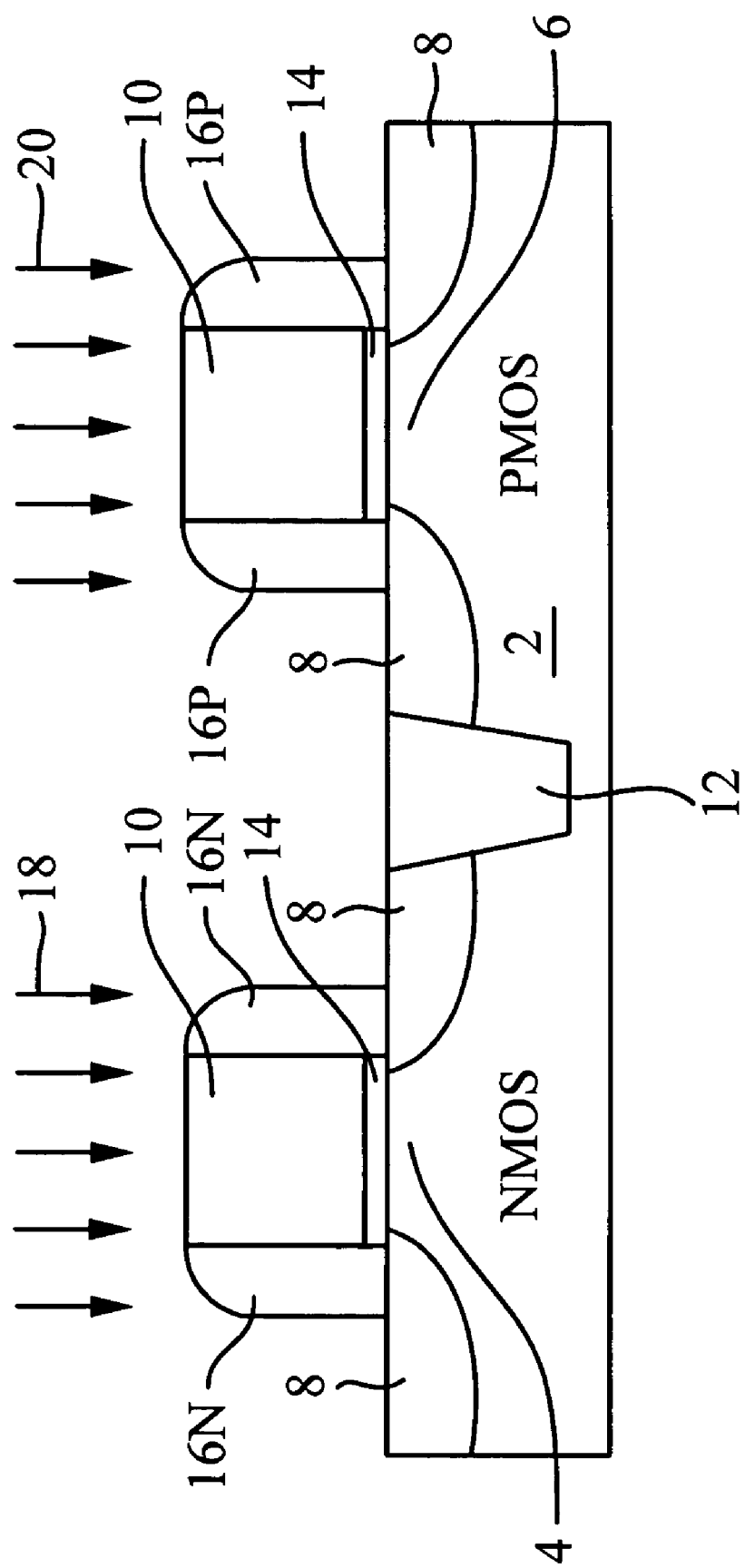
FIGS. 1–4 show a sequence of processing operations performed upon an NMOS and a PMOS transistor according to the present invention.

FIG. 1 is a cross-sectional view showing substrate 2 with NMOS transistor 4 and PMOS transistor 6 formed on substrate 2. Substrate 2 may be silicon or other suitable substrate materials. A shallow trench isolation structure, STI 12 is formed within substrate 2 and between NMOS transistor 4 and PMOS transistor 6. STI 12 may be an oxide but other insulating materials may be used in other exemplary embodiments. Although illustrated side-by-side in FIG. 1, NMOS transistor 4 and PMOS transistor 6 may be located anywhere in the low resistance area of the device, i.e., the area that will undergo silicidation.

Each of PMOS transistor 6 and NMOS transistor 4 include source/drain regions 8, gate 10, and gate dielectric 14. Gate 10 may be formed of conventional materials, such as various metals, polysilicon, polysilicon-germanium, metal silicides, conductive metal nitrides, conductive metal oxides or various combinations or stacks of materials, such as a silicide formed over polysilicon. Gate dielectric 14 may be an oxide such as silicon dioxide, silicon nitride, a nitrogen-doped silicon oxide, various high-k dielectric materials or various combinations thereof. The high-k dielectric may include a dielectric constant of 3.9 or greater. Each of NMOS transistor 4 and PMOS transistor 6 include a set of opposed spacers formed on opposite sidewalls of gate 10. PMOS transistor 6 includes spacers 16P and NMOS transistor 4 includes spacers 16N. Spacers 16N and 16P are formed from the same film during the same processing operations and are therefore formed of the same materials and include the same dimensions. Spacers 16N and 16P are typically formed of doped or undoped oxide materials. N+ implant 18 is used to dope gate 10 of NMOS transistor 4 and to form source/drain regions 8 of NMOS transistor 4. P+ implant 20 is used to dope gate 10 of PMOS transistor 6 and to form source/drain regions 8 of PMOS transistor 6. N+ implant 18 and P+ implant 20 are represented by arrows indicating the dopant species being directed toward the substrate. Although illustrated contemporaneously in FIG. 1, N+ implant 18 and P+ implant 20 are carried out in separate processing operations in which the non-implanted area is masked and protected from the implanted species. NMOS transistor 4 and PMOS transistor 6 are conventionally formed and known to those of ordinary skill in the art and therefore need not be described further herein.

Figure 2:
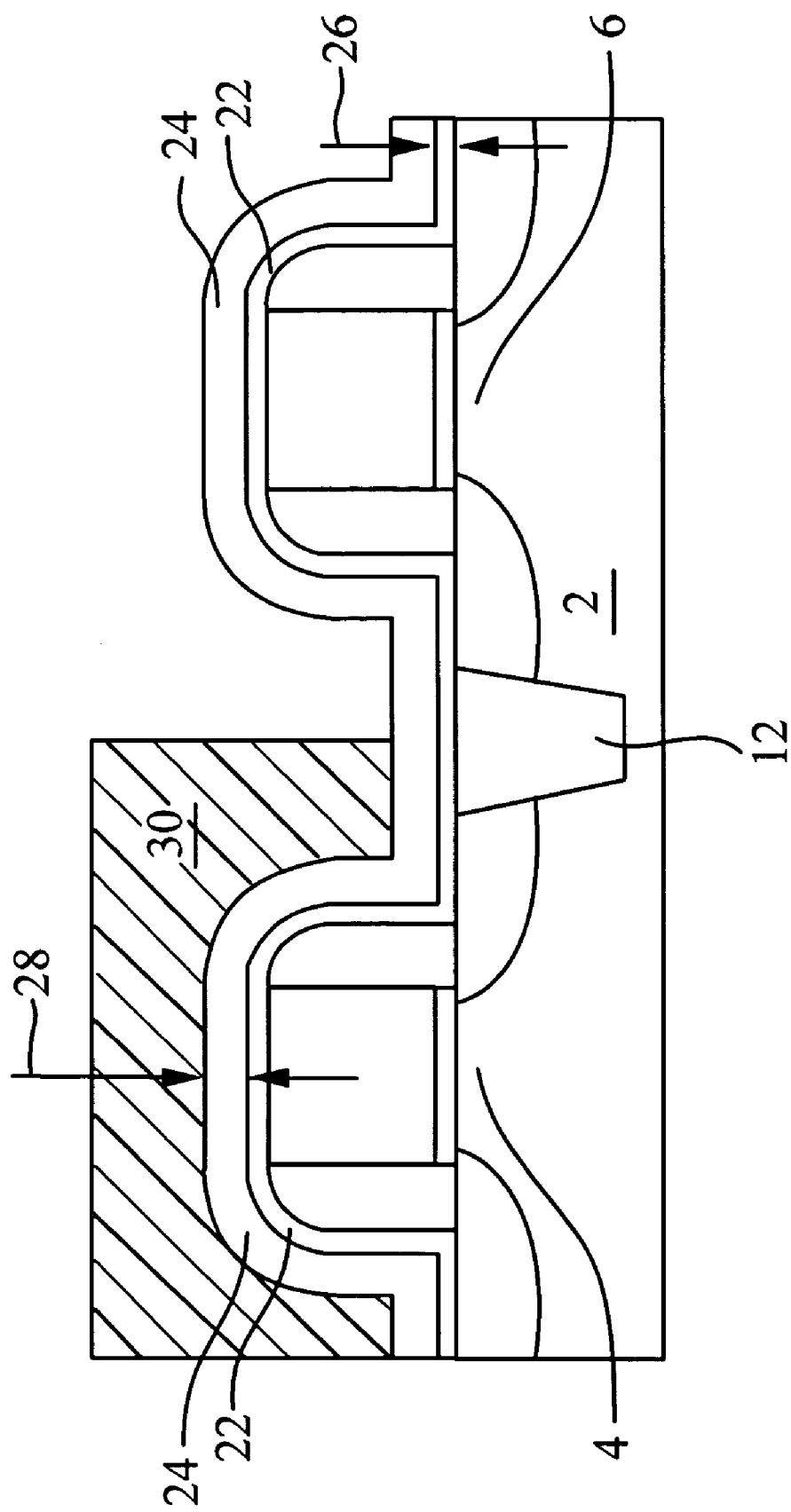

FIG. 2 shows the structure in FIG. 1 after oxide film 22 and nitride film 24 are formed over the structure. Oxide film 22 includes uniform thickness 26 and may be formed using various conventional oxide film deposition methods. Oxide film 22 may be a doped or undoped oxide. Thickness 26 may range from 100 to 400 angstroms in one exemplary embodiment, but other thicknesses may be used in other exemplary embodiments. Various conventional methods may be used to form nitride film 24 over oxide film 22. Nitride film 24 is advantageously a silicon nitride film but other nitrogen-containing films may be used. Nitride film 24 is a stressed nitride film and may be under tensile or compression stress. Thickness 28 of nitride film 24 may range from 150 to 500 angstroms according to one exemplary embodiment, but other thicknesses may be used in other exemplary embodiments. FIG. 2 also shows first patterned photoresist film 30 formed over NMOS transistor 4 (i.e., the NMOS area). Conventional photoresist materials and patterning methods may be used to form first patterned photoresist film 30. PMOS transistor 6 is not protected by first patterned photoresist film 30 and, with first patterned photoresist film 30 in place, an etching operation is used to remove exposed portions of nitride film 24, in particular, from over PMOS transistor 6 (i.e. the PMOS area), according to the illustrated embodiment in which nitride film 24 is advantageously a tensile film. Various suitable dry etching methods may be used. In one exemplary embodiment, a highly selective etch process may be carried out so that oxide film 22 is not significantly attacked and thickness 26 is not reduced in exposed areas during the nitride etch process, i.e., thickness 26 of oxide film 22 is substantially the same in each of the NMOS and PMOS transistor areas. In another exemplary embodiment, an etch process may be used that intentionally erodes oxide film 22 somewhat and diminishes thickness 26 over and around PMOS transistor 6. Various suitable dry or wet etching processes may be used. After the etching process, the patterned photoresist film 30 is removed to form the structure shown in FIG. 3.

Figure 3:
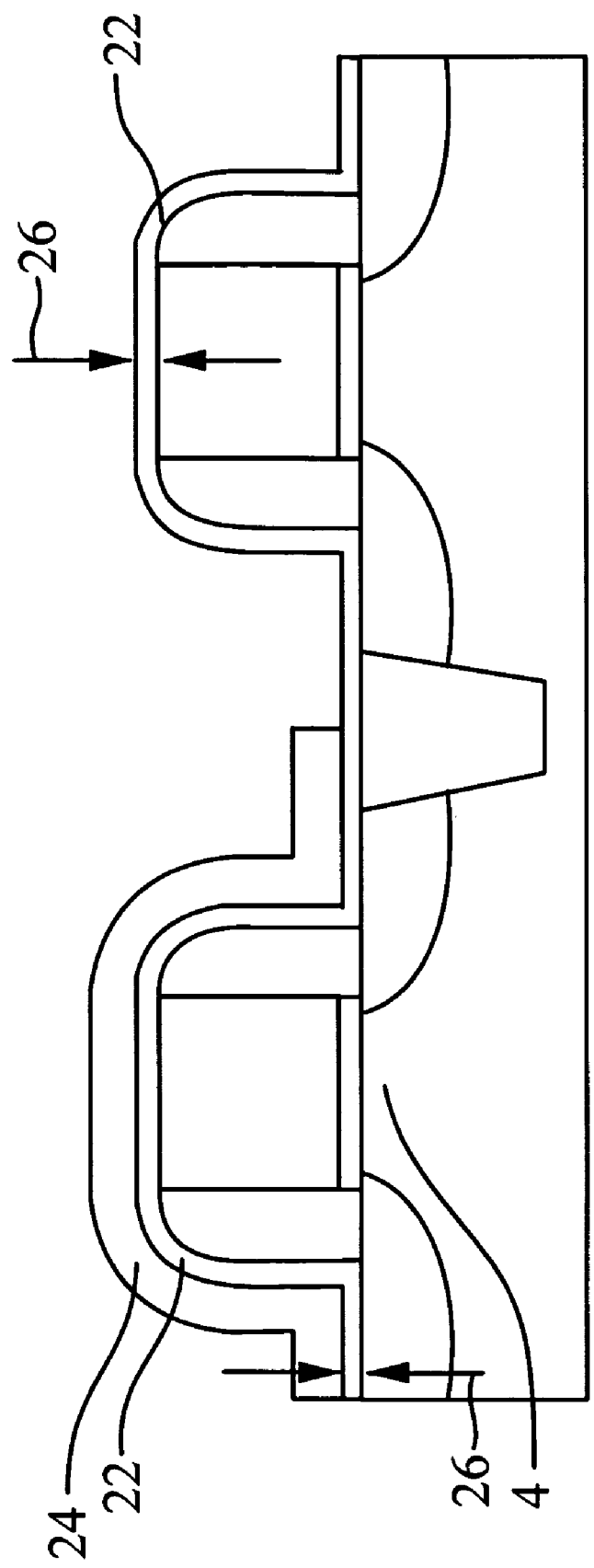

The structure shown in FIG. 3 may undergo various optional cleaning procedures, and is then annealed. The anneal temperature may range from 700° C. to 1100° C. in various exemplary embodiments, but other temperatures may be used in other exemplary embodiments. Various annealing methods may be used. Inert gases may be used, and in one exemplary embodiment, the annealing may be carried out by lamp heating. For example, a halogen lamp or tungsten lamp may be used. The annealing process is advantageously carried out with nitride film 24 remaining only over one of the transistors. In the embodiment in which nitride film 24 is a tensile film, it will remain only over NMOS transistor 4 but not over PMOS transistor 6. The high temperature annealing process is used to correct crystalline damage caused during the source/drain implant processes and to cause the dopant molecules to reside in preferred crystalographic sites in the substrate. The stressed nitride film 24 formed layer over the doped areas, the source/drain and channel, increases the mobility of the carriers in these regions, and therefore amount of current that can flow. This produces a faster circuit including high mobility NMOS transistors.

Applicants have discovered that when a tensile nitride film remains over PMOS transistors during anneal, device degradation occurs but NMOS transistor device yield and performance is improved when a tensile silicon nitride film remains over for NMOS transistors during anneal. The converse is true for compressive type silicon nitride films. When a compressive silicon nitride film is in place over a transistor during anneal, PMOS transistors will exhibit an improved performance whereas NMOS device performance will be degraded. As such, the PMOS device degradation associated with a tensile nitride film in place over the PMOS transistor during anneal can be obviated by the absence of nitride film 24 during the annealing process according to the illustrated embodiment in which nitride film 24 is a tensile nitride film. At the same time, NMOS transistor 4 performance is enhanced due to the presence of nitride film 24 during the annealing process. As such, the present invention provides for retaining a tensile-type nitride film 24 intact over NMOS transistors but not over PMOS transistors during the high temperature anneal. Applicants believe that this PMOS/NMOS dichotomy may be due to the energy band splitting associated with the vertical electric field in MOS structures in which the strain induces an energy splitting associated with crystal asymmetry.

According to the converse embodiment in which nitride film 24 is a compressive nitride film, the nitride film will remain over PMOS transistor 6 and be absent from NMOS transistor 4 during the annealing process.

According to a first further processing sequence, after the anneal procedure is carried out, a wet strip procedure is used to remove nitride film 24. In an exemplary embodiment, a highly selective etchant may be used to remove nitride film 24 without significantly attacking oxide film 22. For example, an etch selectivity of greater than 50:1 may be used. A phosphoric acid solution may be used to remove nitride film 24 in one exemplary embodiment. In another exemplary embodiment, a less selective stripping procedure may be used that removes nitride film 24 while diminishing thickness 26 of oxide film 20 in areas not covered by nitride film 24 during the nitride film stripping operation. Such stripping procedures are available and commonly known in the art. Various wet or dry stripping techniques may be used. CDE (chemical downstream etching) may be used and remote plasma or remote microwave plasma techniques may be used for CDE.

Figure 4:
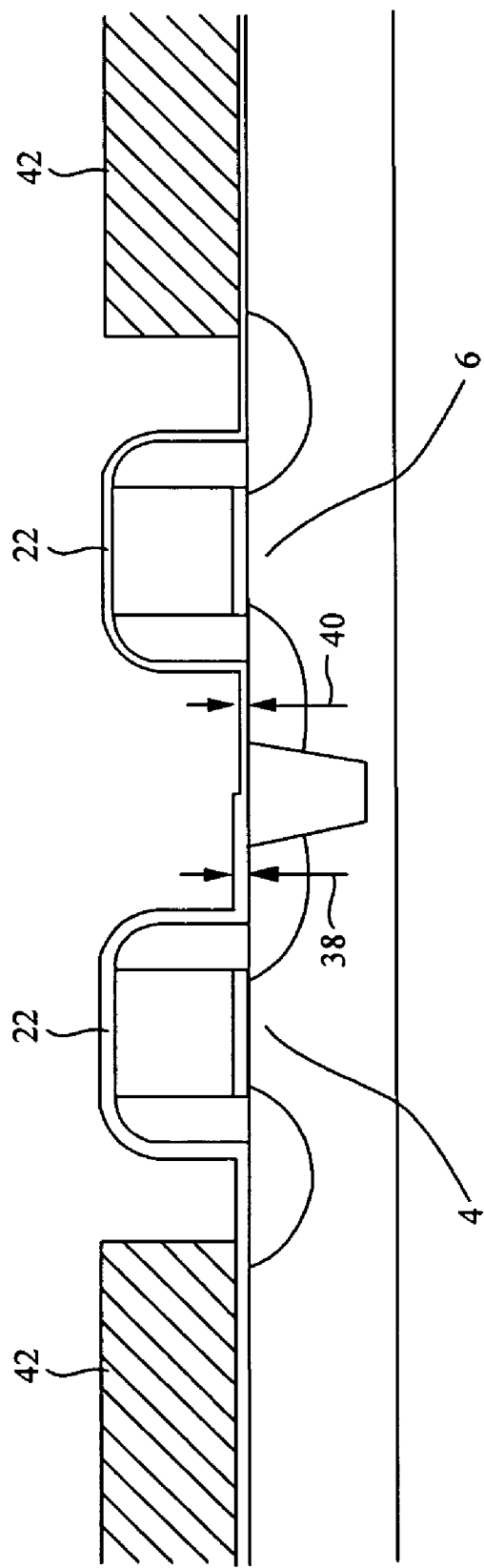

FIG. 4 shows the structure after the nitride film has been removed to expose oxide film 22. Oxide film 22 includes thickness 38 over and about NMOS transistor 4, i.e., in the NMOS region, and thickness 40 over and about PMOS transistor 6, i.e., in the PMOS region. In one exemplary embodiment, in which highly selective etching and stripping processes are used to remove nitride film 24, thicknesses 38 and 40 may be substantially the same. In another exemplary embodiment in which less selective processes are used to remove nitride film 24, thickness 40 may be diminished with respect to original thickness 26 and less than thickness 38. FIG. 4 also shows second patterned photoresist film 42 formed over the high resistance areas after the nitride film strip has been carried out. In portions of the semiconductor device not covered by second patterned photoresist film 42, oxide film 22 will be removed and a silicide formed. Such silicidation lowers resistance, particularly contact resistance, in those areas of the device. In other areas of the device in which the device design mandates high resistance, a silicide layer will not be formed. For example, ESD, electrostatic discharge devices, may be advantageously formed in "high resistance" regions covered by second patterned photoresist film 42. After second patterned photoresist film 42 is formed using conventional materials and methods, conventional wet or dry oxide etch procedures may be carried out to remove oxide layer 22 from exposed areas not covered by photoresist film 42 to enable silicidation. Portions of oxide film 22 covered by second patterned photoresist film 42 remain during the siliciding process and prevent silicidation of those areas. One exemplary structure formed after the removal of oxide layer 22 is shown in FIG. 5A.

Figure 5A:
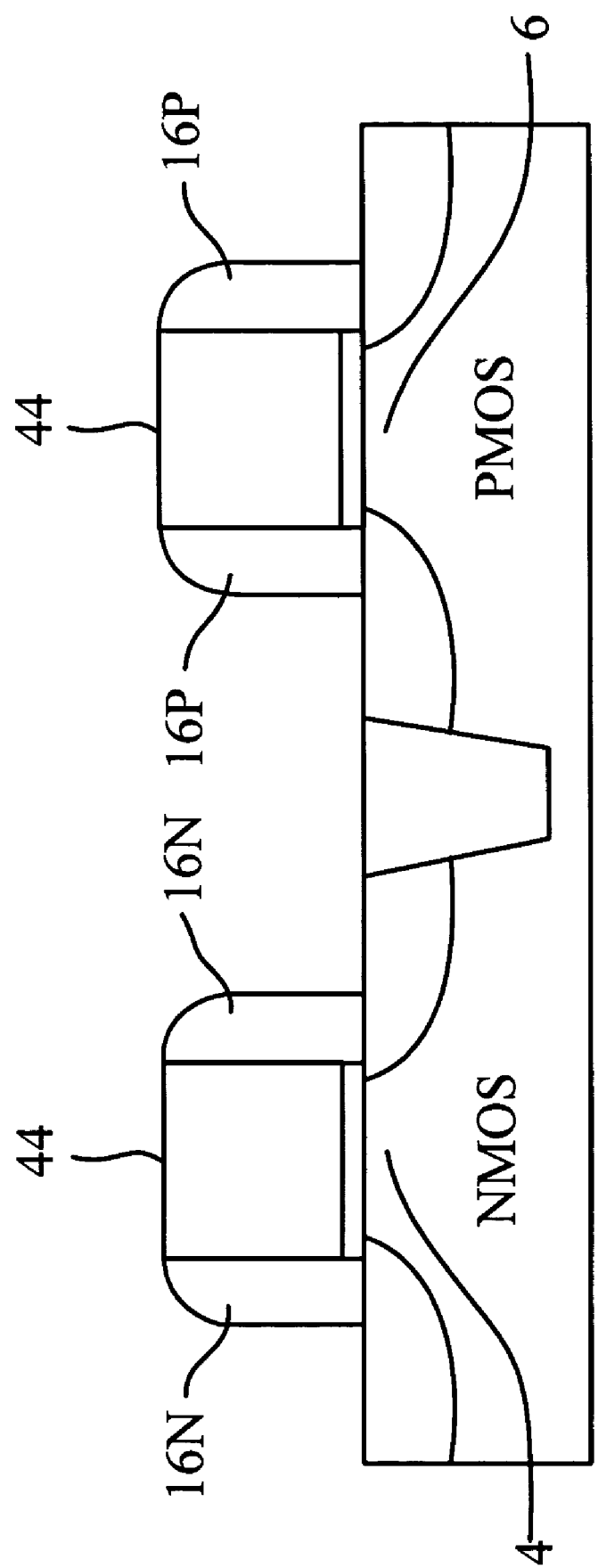
FIG. 5A shows one exemplary structure produced by further processing the structure shown in FIG. 4 according to one exemplary embodiment.
Figure 5B:
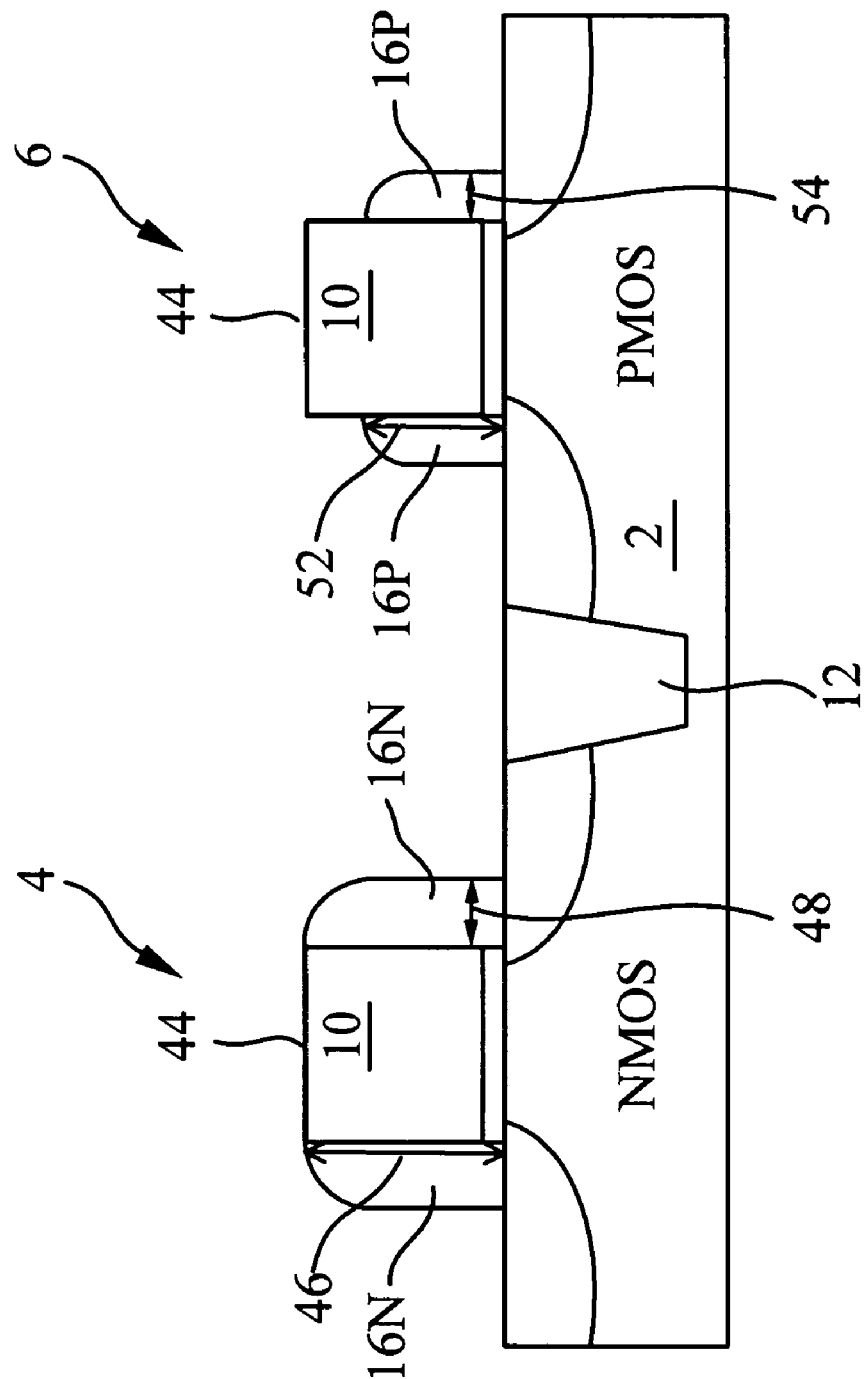
FIG. 5B shows another exemplary structure produced by further processing the structure of FIG. 4 according to another exemplary embodiment.

In FIG. 5A, spacers 16P are sized substantially the same as spacers 16N. FIG. 5A represents an embodiment in which oxide film 22 had a substantially uniform thickness prior to removal. In another exemplary embodiment shown in FIG. 5B, and in which thickness 40 (referring back to FIG. 4) was less than thickness 38, the oxide film with diminished thickness in the vicinity of PMOS transistor 6 is removed earlier than oxide film 22 formed in the vicinity of NMOS transistor 4 and the size of spacers 16P is less than that of spacers 16N because oxide spacers 16N and 16P are subject to attack during the oxide removal operation. Spacers 16N and 16P were originally formed from the same film and using the same processing operations. FIG. 5B shows that each of width 54 and height 52 of spacers 16P is less than corresponding width 48 and height 46 of NMOS transistor 4. In other words, each of the spacer CDs (critical dimensions) are reduced in spacers 16P compared to spacers 16N. Spacers 16P are receded below top surface 44 of gate 10.

The silicidation process is carried out upon a structure such as shown in FIG. 5A or 5B. Conventional methods and conventional materials such as Co, W, Ta, Ti and Ni may be used.

Figure 6:
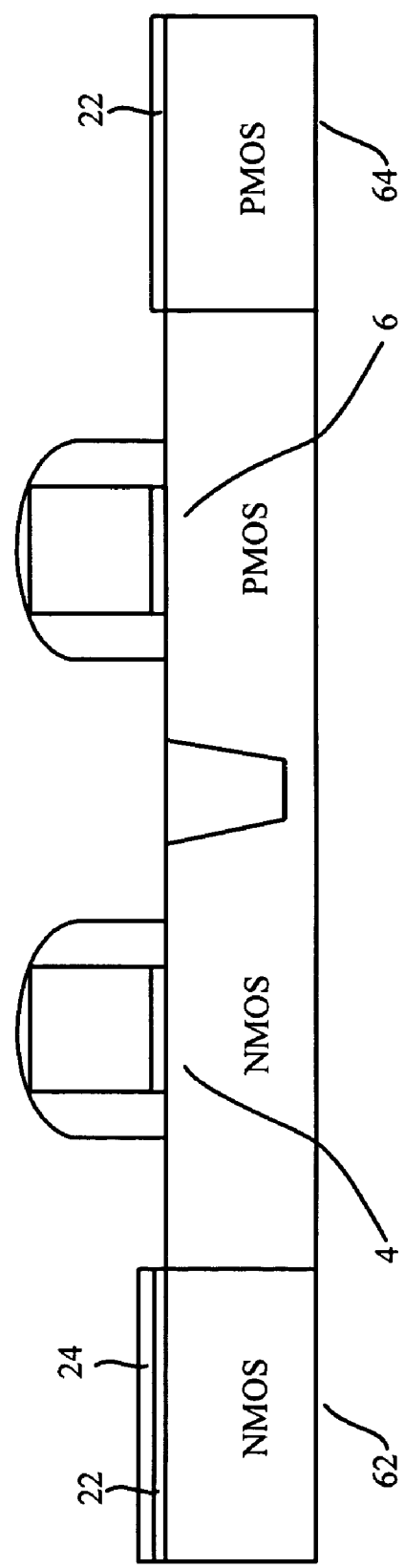
FIG. 6 shows a structure that includes differently processed NMOS and PMOS high resistance areas according to one exemplary embodiment of the present invention.

According to a second further processing sequence, the invention provides for extending this NMOS-PMOS asymmetry to high resistance areas of the device. For example, PMOS and NMOS transistors in high resistance areas may be formed to have differently sized spacers. According to this exemplary embodiment, the nitride film remains in the high resistance NMOS regions during anneal, then, after anneal, second patterned photoresist film 42 is formed prior to stripping nitride film 24 and covers nitride film 24 in NMOS high-resistance portions. Nitride film 24 and oxide film 22 are then removed in exposed areas, and then photoresist film 42 is removed to produce the structure shown in FIG. 6. It can be seen that within high resistance areas 62 and 64, high resistance NMOS area 62 differs structurally from high resistance PMOS area 64, as only NMOS area 62 includes nitride film 24.

Figure 7:
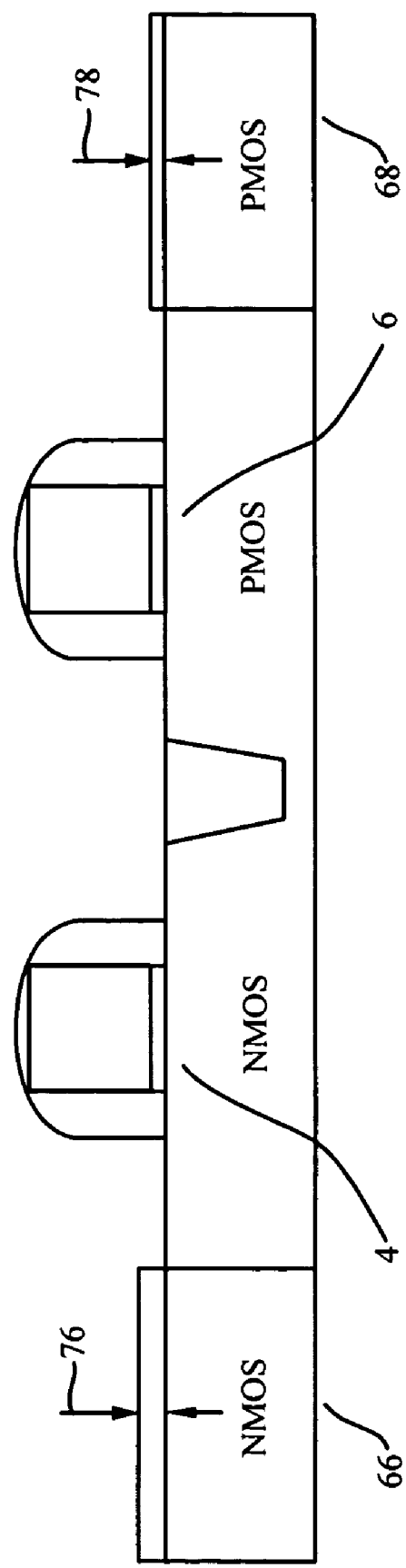
FIG. 7 shows a further structure that includes differently processed NMOS and PMOS high resistance areas according to another exemplary embodiment of the present invention.

FIG. 7 shows a structure produced according to another further processing sequence that includes the sequence of operations shown in FIGS. 1 to 4 and in which first patterned photoresist film 30 extends into the NMOS high resistance area 66 but not into PMOS high resistance area 68. Either or both the nitride dry etch process and the nitride stripping process includes a selectivity that results in oxide layer 22 having a diminished thickness in PMOS area 68 compared to NMOS high resistance area 68. After removing oxide film 22 from areas uncovered by second patterned photoresist film 42 and stripping second patterned photoresist film 42, oxide film 22 that remains in NMOS high resistance region 66 includes thickness 76 which is greater than thickness 78 of oxide layer 22 that remains in PMOS high resistance area 68 when the oxide film has been removed from the low resistance areas. Either of the embodiments shown in FIGS. 6 and 7 may be further processed according to methods described above, to produce PMOS and NMOS transistors having differently sized spacers in the high resistance regions of the device. Thus, the techniques of PMOS spacers having different dimensions than NMOS spacers can be extended to high resistance regions of the device.

Figure 8A:
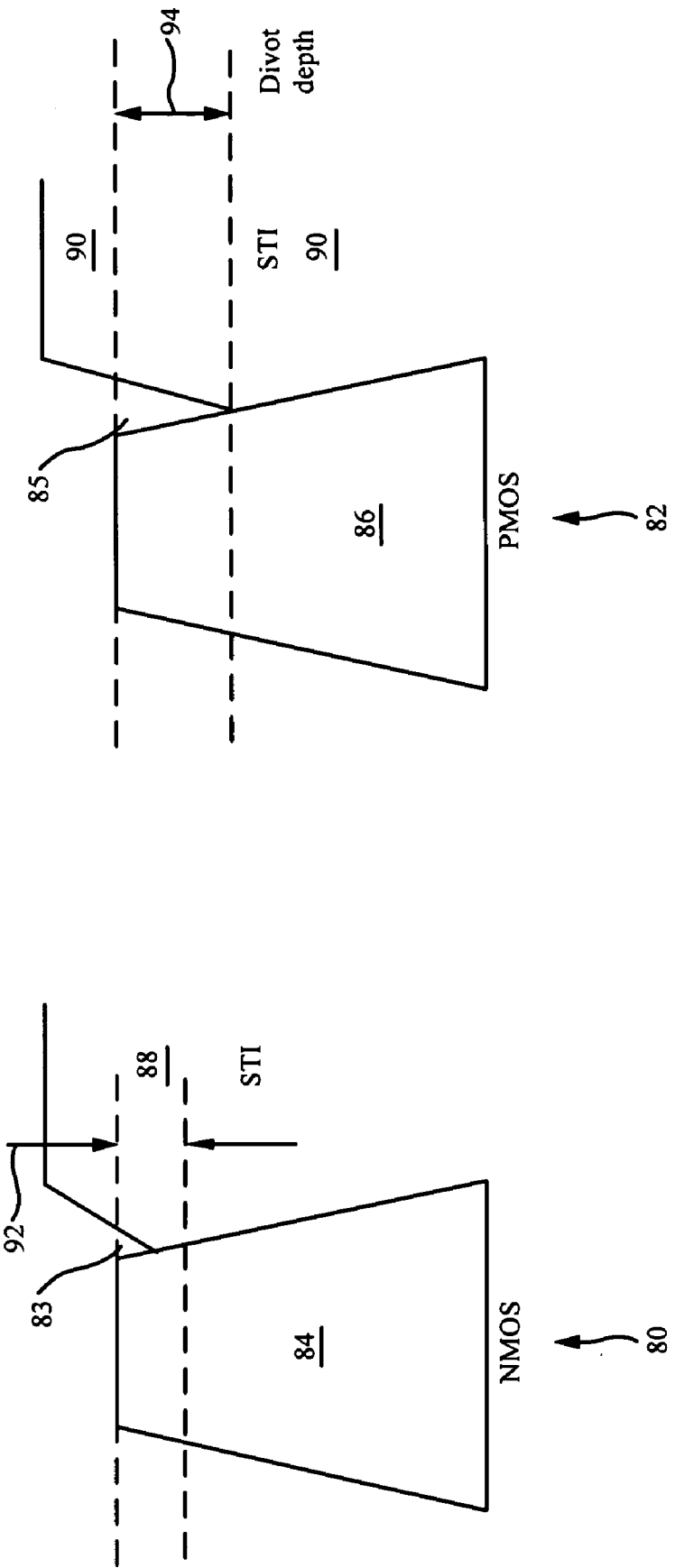
FIGS. 8A and 8B show further structures that includes differently processed NMOS and PMOS areas according to another exemplary embodiment of the present invention.
Figure 8B:
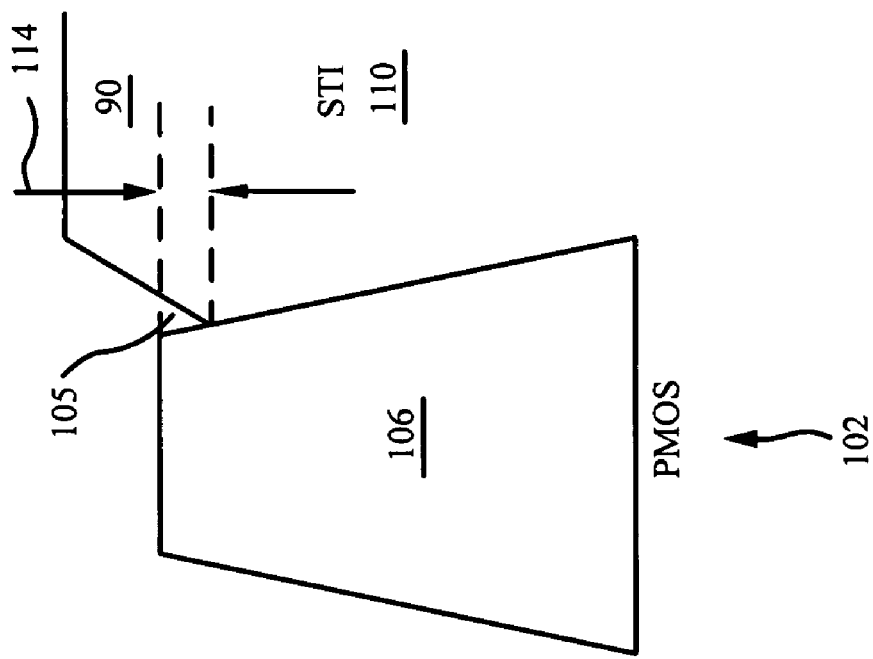
Figure 8B:
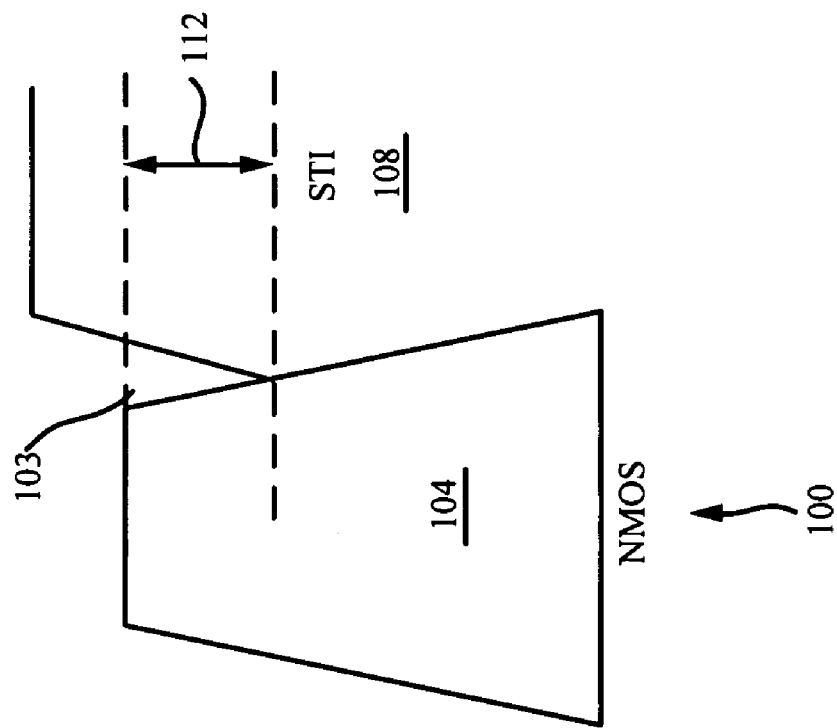

FIGS. 8A and 8B show further aspects of the present invention. More particularly, each of FIGS. 8A and 8B show how PMOS and NMOS structures formed in the same device can be formed to include different physical characteristics using the methods of the present invention. In FIG. 8A, NMOS region 80 and PMOS region 82 are formed in the same semiconductor substrate. As previously described, a sequence of processing operations may be performed upon a substrate that includes a silicon nitride film, preferably a tensile silicon nitride film, formed in NMOS region 80 but not in PMOS region 82. Such an arrangement of the silicon nitride film being disposed only over NMOS region 80 may be produced using the previously described processing operations. The effect is illustrated in the difference in the depth of divots formed between an STI structure and the substrate in PMOS region 82 versus the depth of divots formed between an STI structure and the substrate in NMOS region 80. In NMOS region 80 of FIG. 8A, a portion of STI structure 88 is formed adjacent active region 84 and includes divot 83 formed between STI structure 88 and active area 84, which is part of the substrate. On the same substrate, in PMOS region 82 of FIG. 8A, divot 85 formed between active area 86 and STI structure 90 in PMOS region 82 includes depth 94 which is greater than depth 92 of divot 83 formed in NMOS region 80.

FIG. 8B shows NMOS region 100 and PMOS region 102 formed in the same semiconductor substrate. According to the exemplary embodiment illustrated in FIG. 8B, a silicon nitride film, preferably a compressive silicon nitride film, is allowed to remain over PMOS region 102 but not NMOS region 100 during selected subsequent processing operations (as discussed above) and results in a smaller divot 105 formed between STI structure 110 and active area 106 in PMOS region 102 than the divot 103 formed between STI structure 108 and active area 104 formed in NMOS region 100. Divot 103 formed between active area 104 and STI structure 108 in NMOS region 100 includes depth 112 which is greater than depth 114 of divot 105 formed between active area 106 and STI structure 110 of PMOS region 102. The active areas are formed in the semiconductor substrate. Various aspects of the present invention provide different resulting physical structures when a stressed silicon nitride film is formed over one, but not both of NMOS and PMOS regions formed in a semiconductor substrate and which remain during subsequent processing operations.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:
    forming a plurality of transistors with un-annealed source/drain regions, said plurality of transistors including a PMOS transistor and an NMOS transistor;
    forming an oxide film on said plurality of transistors;
    depositing a stressed silicon nitride film on said oxide film over said NMOS transistor and said PMOS transistor then removing said stressed silicon nitride film from over said PMOS transistor, said stressed silicon nitride film being under tensile stress;
    annealing said source/drain regions with said stressed silicon nitride film over said said NMOS transistor; and
    after said annealing, stripping said stressed silicon nitride film from over said NMOS transistor such that said removing and said stripping diminish a thickness of said oxide film over said PMOS transistor.

2. The method as in claim 1, wherein said forming a plurality of transistors includes forming said PMOS and NMOS transistors to each include sidewall spacers, and further comprising, after said stripping said stressed silicon nitride film, removing said oxide film from over said PMOS and NMOS transistors such that a width of said sidewall spacers of said PMOS transistor is less than a width of said sidewall spacers of said NMOS transistor.

3. The method as in claim 2, wherein said forming a plurality of transistors includes forming a corresponding PMOS shallow trench isolation (STI) structure in a substrate adjacent at least said PMOS transistor and toning a corresponding NMOS STI structure in a substrate adjacent at least said NMOS transistor and wherein said removing said stressed silicon nitride film, said stripping and said removing said oxide film create divots of a first depth between said NMOS STI structure and said substrate; and divots of a second depth being greater than said first depth, between said PMOS STI structure and said substrate.

4. The method as in claim 1, wherein said removing comprises forming a pattern in a photosensitive material then dry or wet etching.

5. The method as in claim 1, wherein said stripping comprises
   wet etching;
   and further comprising, after said stripping, patterning said oxide film; and
   siliciding said PMOS transistor and said NMOS transistor while said oxide film remains over other portions of said semiconductor device and prevents silicidation of said other portions during said siliciding.

6. The method as in claim 5, wherein said siliciding comprises forming a metal suicide on exposed silicon portions of said PMOS transistor and said NMOS transistor.

7. The method as in claim 6, wherein said metal comprises at least one of Co, Te, Ti, W and Ni.

8. The method as in claim 1, further comprising, after said stripping, siliciding exposed silicon portions of said PMOS transistor and said NMOS transistor but not further portions of said semiconductor device.

9. The method as in claim 8, wherein said stripping comprises a blanket wet etch in phosphoric acid or chemical downstream etching (CDE).

10. The method as in claim 9, wherein said chemical downstream etching is carded out using remote plasma or remote microwave plasma.

11. The method as in claim 1, wherein said annealing takes place at a temperature within a range of 600° C. to 1500° C.

12. The method as in claim 1, wherein said annealing comprises an RTA (rapid thermal anneal) process that takes place using one of a halogen lamp, a tungsten lamp and a further lamp.

13. The method as in claim 1, wherein at least one of said NMOS transistor and said PMOS transistor has a gate oxide formed of at least one of silicon dioxide, silicon nitride, a nitrogen-doped silicon oxide, and a high-k dielectric having a dielectric constant greater than 3.9.

14. The method as in claim 1, wherein at least one of said NMOS transistor and said PMOS transistor has a gate electrode comprised of at least one of polysilicon, polysilicon-germanium, metal, a metal silicide, a conductive metal nitride and a conductive metal oxide.

15. A method for forming a semiconductor device comprising:
   forming a plurality of transistors including a PMOS transistor and an NMOS transistor, each having sidewall spacers;
   forming an oxide film on said plurality of transistors and,
   before said plurality of transistors has been annealed, forming a silicon nitride film over said oxide film and removing said silicon nitride film from over one of said PMOS transistor and said NMOS transistor then annealing,
   stripping said silicon nitride film from over the other of said PMOS transistor and said NMOS transistor to reduce a thickness of said oxide film over said one of said PMOS transistor and said NMOS transistor relative to a thickness of said oxide film over said other of said PMOS transistor and said NMOS transistor; and
   removing said oxide film from at least portions of said semiconductor device, including from said NMOS transistor and said PMOS transistor, such that a width of said sidewall spacers of said one of said PMOS transistor and said NMOS transistor is less than a width of said sidewall spacers of said other of said PMOS transistor and said NMOS transistor.

* * * * *

UNITED STATES PATENT AND TRADEMARK OFFICE
CERTIFICATE OF CORRECTION

| | |
|---|---|
| PATENT NO. | : 7,223,647 B2 |
| APPLICATION NO. | : 10/981925 |
| DATED | : May 29, 2007 |
| INVENTOR(S) | : Ju-Wang Hsu et al. |

It is certified that error appears in the above-identified patent and that said Letters Patent is hereby corrected as shown below:

Column 1, line 50, delete "suicide" and insert therefore -- silicide -- .

Column 1, line 54, delete "suicide" and insert therefore -- silicide -- .

Column 8, line 57, delete "toning" and insert therefore -- forming -- .

Column 8, line 62, delete "substrate;" and insert therefore -- substrate, --.

Column 9, line 11, delete "suicide" and insert therefore -- silicide -- .

Column 9, line 14, delete "Te" and insert therefore -- Ta -- .

Column 9, line 23, delete "carded" and insert therefore -- carried -- .

Signed and Sealed this

Twenty-third Day of October, 2007

JON W. DUDAS
*Director of the United States Patent and Trademark Office*